(12) United States Patent
Kim et al.

(10) Patent No.: US 10,886,499 B2
(45) Date of Patent: Jan. 5, 2021

(54) LIGHT EMITTING DISPLAY APPARATUS AND METHOD OF MANUFACTURING THE SAME

(71) Applicant: LG DISPLAY CO., LTD., Seoul (KR)

(72) Inventors: Goeun Kim, Incheon (KR); YoungHoon Shin, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/512,032

(22) Filed: Jul. 15, 2019

(65) Prior Publication Data
US 2020/0075887 A1 Mar. 5, 2020

(30) Foreign Application Priority Data

Aug. 28, 2018 (KR) .................. 10-2018-0101229
Dec. 31, 2018 (KR) .................. 10-2018-0173630

(51) Int. Cl.
*H01L 51/00* (2006.01)
*H01L 27/00* (2006.01)
*H01L 51/52* (2006.01)

(52) U.S. Cl.
CPC ...... *H01L 51/5243* (2013.01); *H01L 51/5206* (2013.01); *H01L 51/5221* (2013.01); *H01L 51/5246* (2013.01)

(58) Field of Classification Search
CPC ............ H01L 51/5243; H01L 51/5221; H01L 51/5246; H01L 51/5206; H01L 27/3258; H01L 27/3246; H01L 27/322; H01L 2251/5369
See application file for complete search history.

(56) References Cited

U.S. PATENT DOCUMENTS

| | | | | |
|---|---|---|---|---|
| 7,294,517 B2* | 11/2007 | Takayama | ........... | H01L 27/3258 438/149 |
| 8,822,110 B2* | 9/2014 | Lee | ........................ | G03F 7/027 430/270.1 |
| 8,981,359 B2* | 3/2015 | Kum | .................... | H01L 27/3258 257/40 |
| 9,865,840 B2* | 1/2018 | Kim | .................... | H01L 51/5253 |
| 10,454,068 B2* | 10/2019 | Lee | ......................... | H01L 51/56 |

(Continued)

FOREIGN PATENT DOCUMENTS

| JP | 2015-79755 A | 4/2015 |
|---|---|---|
| KR | 10-2015-0044522 A | 4/2015 |

(Continued)

OTHER PUBLICATIONS

Tanaka et al., "Theory of hydrogen absorption in metal hydrides", 1981, Physical Review B, vol. 24, No. 4 pp. 1771-1776, Aug. 15, 1981 (Year: 1981).*

*Primary Examiner* — Nikolay K Yushin
(74) *Attorney, Agent, or Firm* — Birch, Stewart, Kolasch & Birch, LLP

(57) ABSTRACT

A light emitting display apparatus includes a passivation layer on a thin film transistor, a light emitting diode on the passivation layer, the light emitting diode having an anode, a light emitting layer on the anode, and a cathode on the light emitting layer, and a hydrogen absorbing layer on the light emitting diode, the hydrogen absorbing layer including an inorganic material having a mass percentage of 0.08% to 50%.

35 Claims, 5 Drawing Sheets

(56) References Cited

U.S. PATENT DOCUMENTS

| | | | | |
|---|---|---|---|---|
| 2003/0089913 A1* | 5/2003 | Takayama | ........... | H01L 27/3258 257/79 |
| 2013/0143158 A1* | 6/2013 | Lee | ......................... | G03F 7/027 430/280.1 |
| 2014/0175394 A1* | 6/2014 | Kum | ................... | H01L 27/3258 257/40 |
| 2015/0340655 A1* | 11/2015 | Lee | ....................... | H01L 27/322 257/40 |
| 2016/0087241 A1* | 3/2016 | Kim | ................... | H01L 51/5253 257/40 |

FOREIGN PATENT DOCUMENTS

| | | |
|---|---|---|
| KR | 10-2016-0035733 A | 4/2016 |
| KR | 10-2016-0059053 A | 5/2016 |
| KR | 10-2016-0137842 A | 12/2016 |
| KR | 10-2017-0002985 A | 1/2017 |

\* cited by examiner

LIGHT EMITTING DISPLAY APPARATUS AND METHOD OF MANUFACTURING THE SAME

CROSS-REFERENCE TO RELATED APPLICATIONS

This application claims priority to Korean Patent Application No. 10-2018-0101229 filed on Aug. 28, 2018 and Korean Patent Application No. 10-2018-0173630 filed on Dec. 31, 2018, in the Korean Intellectual Property Office, the disclosures of all these applications are incorporated herein by reference into the present application.

BACKGROUND

Technical Field

The present disclosure relates to a light emitting display apparatus and a method of manufacturing the same, and more particularly, to a light emitting display apparatus which is capable of reducing a defect of a thin film transistor due to hydrogen and a method of manufacturing the same.

Description of the Related Art

The light emitting display apparatus is a self-emitting display apparatus so that a separate light source is not necessary, which is different from the liquid crystal display apparatus. Therefore, the light emitting display apparatus can be manufactured to have light weight and small thickness. Further, since the light emitting display apparatus is driven at a low voltage, it is advantageous not only in terms of power consumption, but also in the implementation of colors, the response speed, the viewing angle, and the contrast ratio, so that the light emitting display apparatus is being studied as next generation displays.

In the light emitting display apparatus, a light emitting diode disposed in each sub pixel is driven to emit light. In this case, in order to independently drive the light emitting diodes of the sub pixels, one or more thin film transistors (TFT) which are electrically connected to the light emitting diode are disposed in each sub pixel.

The thin film transistor includes a gate electrode, a source electrode, a drain electrode, and a semiconductor layer. The source electrode and the drain electrode are in contact with the semiconductor layer and the gate electrode is disposed so as to overlap the semiconductor layer. When a gate voltage of a predetermined voltage or higher is applied to the gate electrode of the thin film transistor, a channel is formed in the semiconductor layer so as to allow the current to flow between the source electrode and the drain electrode. As described above, the thin film transistor has a switching characteristic and the switching characteristic can be determined by various factors. For example, when a material of the semiconductor layer is deformed, mobility of the thin film transistor is changed so that the switching characteristic of the thin film transistor can be changed.

The light emitting display apparatus includes a passivation layer which protects the light emitting diode from moisture or oxygen penetrating the light emitting diode. The passivation layer is formed on the light emitting diode to protect the light emitting diode.

The passivation layer is formed by, for example, a chemical vapor deposition (CVD) method using silane ($SiH_4$) and ammonia ($NH_3$). During the process of forming the passivation layer by the chemical vapor deposition method, a small amount of hydrogen can be generated from silane and ammonia. Therefore, the hydrogen generated during the process of forming the passivation layer is diffused to the passivation layer to be included in the passivation layer. The residual hydrogen included in the passivation layer can move in the light emitting diode. When the residual hydrogen is diffused to the semiconductor layer of the thin film transistor to react with the semiconductor layer, the characteristic of the thin film transistor can be modified. Therefore, the hydrogen generated during the process of forming the passivation layer can degrade not only the performance of the thin film transistor, but also the performance of the light emitting display apparatus.

SUMMARY OF THE INVENTION

In order to solve the problem in that hydrogen generated when the passivation layer of the light emitting display apparatus is formed remains in the light emitting display apparatus and the residual hydrogen is diffused towards the thin film transistor so that the characteristic of the thin film transistor is modified to degrade the performance of the light emitting display apparatus, inventors of the present disclosure invented a new structure of a light emitting display apparatus which is capable of absorbing the hydrogen included in the passivation layer and a method of manufacturing the same.

Therefore, an object to be achieved by the present disclosure is to provide a light emitting display apparatus which suppresses the degradation of the performance of the thin film transistor by absorbing hydrogen remaining in the passivation layer and a method of manufacturing a light emitting display apparatus.

Further, another object to be achieved by the present disclosure is to provide a light emitting display apparatus having a structure which is capable of removing hydrogen in a passivation layer without providing a separate device for removing hydrogen generated during the process of forming a passivation layer and a method of manufacturing a light emitting display apparatus.

Objects of the present disclosure are not limited to the above-mentioned objects, and other objects, which are not mentioned above, can be clearly understood by those skilled in the art from the following descriptions.

According to an aspect of the present disclosure, a light emitting display apparatus includes a passivation layer on a thin film transistor, a light emitting diode on the passivation layer and includes an anode, a light emitting layer on the anode, and a cathode on the light emitting layer, and a hydrogen absorbing layer on the light emitting diode and includes an inorganic material having a mass percenatage of 0.08% to 50%.

According to another aspect of the present disclosure, a light emitting display apparatus includes a lower substrate, a thin film transistor on the lower substrate and includes an oxide semiconductor layer, a passivation layer on the thin film transistor, a light emitting diode on the thin film transistor and the passivation layer and includes an anode, a light emitting layer on the anode, and a cathode on the light emitting layer, and a seal in contact with the light emitting diode, the seal including a hydrogen absorbing filler.

According to another aspect of the present disclosure, a light emitting display apparatus includes a lower substrate including a thin film transistor and a light emitting diode, an upper substrate on the lower substrate, an adhesive layer between the lower substrate and the upper substrate, and the adhesive layer being on the thin film transistor, and a seal between the adhesive layer and the upper substrate, the seal including a hydrogen absorbing filler in contact with the adhesive layer.

According to another aspect of the present disclosure, a method of manufacturing a light emitting display apparatus includes: forming a thin film transistor on a lower substrate, forming a passivation layer on the thin film transistor, forming a light emitting diode including an anode, a light emitting layer, and a cathode on the passivation layer, and forming a hydrogen absorbing layer including a hydrogen absorbing filler on the light emitting diode.

Other detailed matters of the embodiments are included in the detailed description and the drawings.

According to the present disclosure, a hydrogen absorbing layer which absorbs hydrogen remaining in a passivation layer which can modify a characteristic of a thin film transistor is configured to suppress the degradation of the performance of the thin film transistor.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION OF THE EMBODIMENTS

Figure 1A:
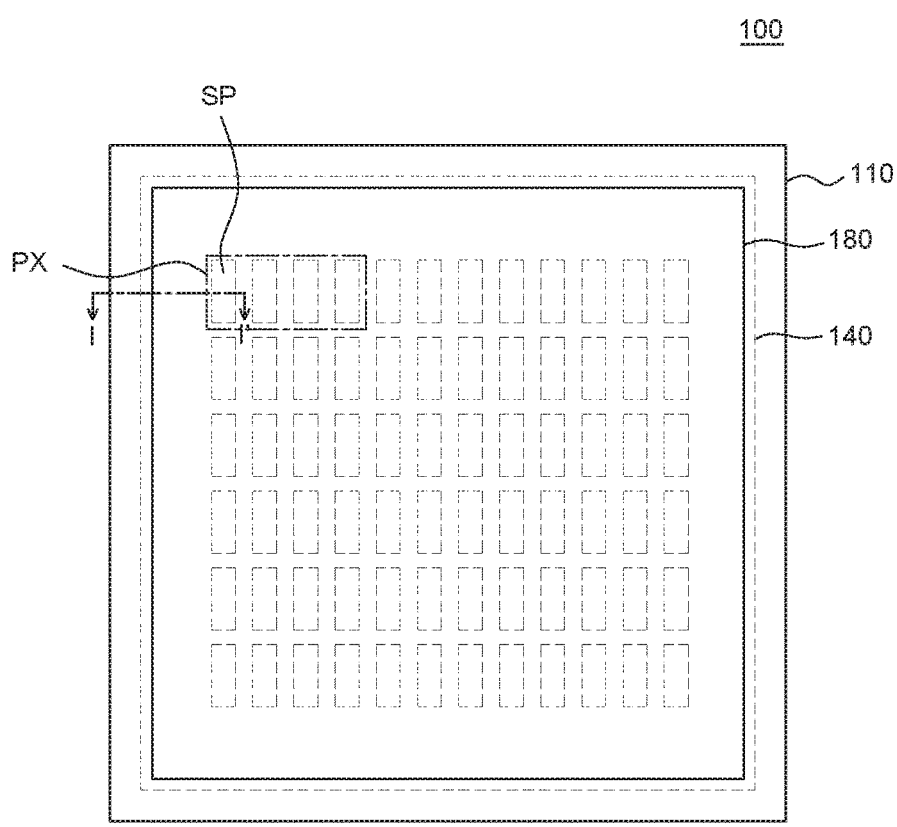
FIG. 1A illustrates a light emitting display apparatus according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on," "above," "below," and "next," one or more parts can be positioned between the two parts unless the terms are used with the term "immediately" or "directly."

When an element or layer is disposed "on" another element or layer, another layer or another element can be interposed directly on the other element or therebetween.

Although the terms "first," "second," and the like are used for describing various components, these components are not confined by these terms. These terms are merely used for distinguishing one component from the other components. Therefore, a first component to be mentioned below can be a second component in a technical concept of the present disclosure.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus according to embodiments of the present disclosure will be described in detail with reference to accompanying drawings.

Figure 1B:
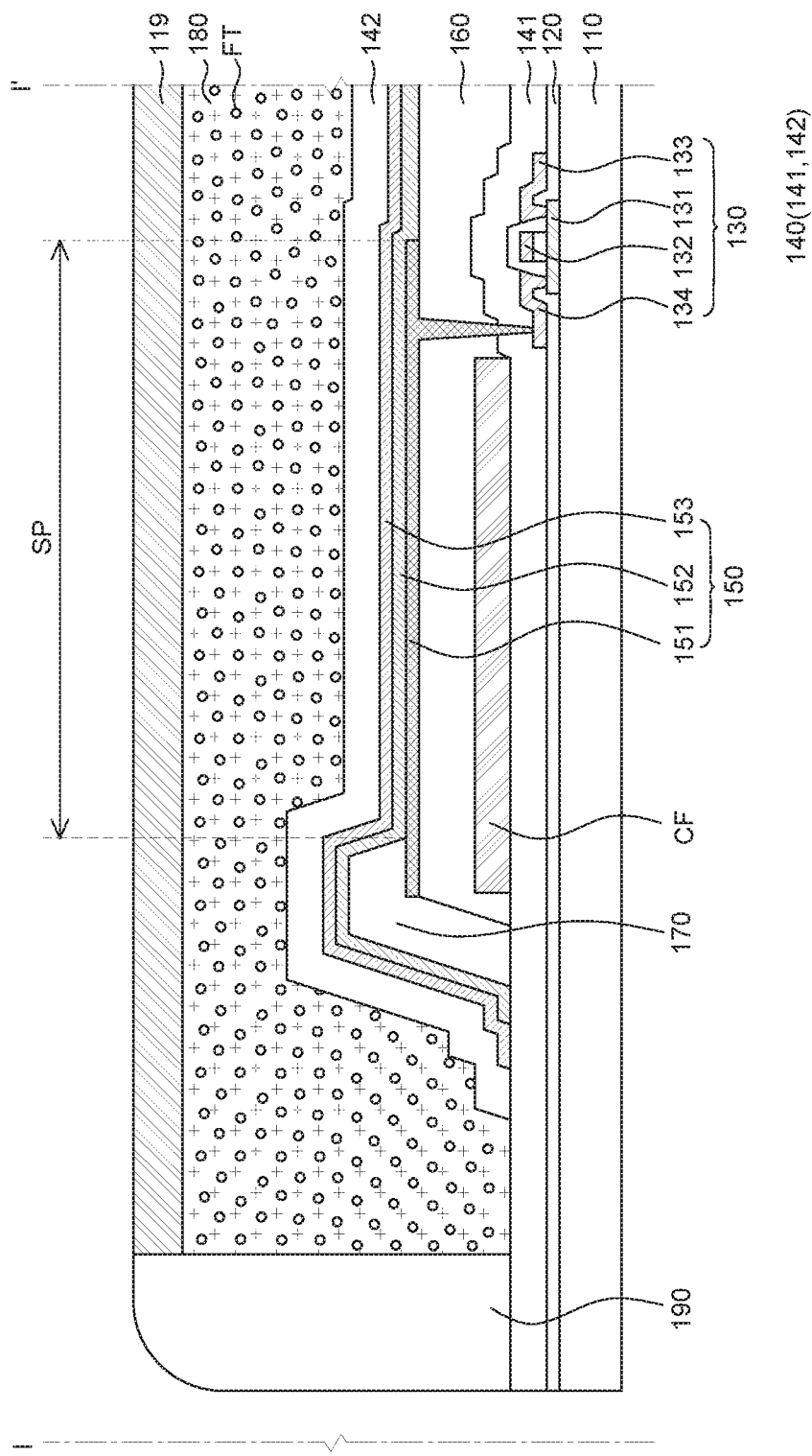
FIG. 1B is a cross-sectional view taken along the line I-I' of FIG. 1A.

FIG. 1A illustrates a light emitting display apparatus according to an embodiment of the present disclosure and FIG. 1B is a cross-sectional view taken along the line I-I' of FIG. 1A.

For example, in FIG. 1A, the line I-I' is disposed at one side of a light emitting display apparatus 100 so that FIG. 1B is a cross-sectional view taken along one side of the light emitting display apparatus 100.

With reference to FIGS. 1A and 1B, the light emitting display apparatus 100 includes a lower substrate 110, a gate insulating layer 120, a thin film transistor 130, a passivation layer 140, a light emitting diode 150, an over coating layer 160, a bank 170, a hydrogen absorbing layer 180, a side seal member 190, and an upper substrate 119.

The passivation layer 140 includes a first passivation layer 141 which covers the thin film transistor 130 and a second passivation layer 142 which covers the light emitting diode 150.

For reference, for the convenience of description, in FIG. 1A, only the passivation layer 140 and the hydrogen absorbing layer 180 of the light emitting display apparatus 100 are illustrated.

With reference to FIG. 1A, the light emitting display apparatus 100 includes a plurality of pixels PX. Each pixel PX includes a plurality of sub pixels SP. The sub pixel SP can be a basic emission unit which configures the light emitting display apparatus 100 and each of the sub pixels SP which configures one pixel PX emits light having different colors. As illustrated in FIG. 1A, the sub pixel SP can include a red sub pixel, a green sub pixel, a blue sub pixel, and a white sub pixel or include only a red sub pixel, a green sub pixel, and a blue sub pixel.

Further, with reference to FIG. 1B, the display apparatus 100 according to an embodiment of the present disclosure can include a sub pixel SP having a color-filter on transistor (COT) structure. For example, colors of the sub pixels SP can be implemented by a color filter CF disposed on an upper layer of the thin film transistor 130 so as to overlap the emission area of the sub pixel SP. For example, when the light emitting diode 150 emits white light, a red color filter CF is disposed in an area corresponding to the emission area of the light emitting diode 150 to implement a red sub pixel SP. Further, a green color filter CF is disposed in an area corresponding to the emission area of the light emitting diode 150 to implement a green sub pixel SP. Further, a blue color filter CF is disposed in an area corresponding to the emission area of the light emitting diode 150 to implement a blue sub pixel SP. Furthermore, no color filter CL is disposed in an area corresponding to the emission area of the light emitting diode 150 to implement a white sub pixel SP. Details of the color filter CF will be described below.

The thin film transistor 130 including a semiconductor layer 131, a gate electrode 132, a source electrode 133, and a drain electrode 134 is formed on the lower substrate 110 which is formed of an insulating material. For example, the semiconductor layer 131 is formed on the lower substrate 110 and the gate insulating layer 120 which insulates the gate electrode 132 from the semiconductor layer 131 is disposed on the semiconductor layer 131 and the lower substrate 110. The gate electrode 132 is formed on the gate insulating layer 120 and the source electrode 133 and the drain electrode 134 are formed on the semiconductor layer 131 and the gate insulating layer 120. The source electrode 133 and the drain electrode 134 are in contact with the semiconductor layer 131 to be electrically connected to the semiconductor layer 131 and are formed on a partial area of the gate insulating layer 120. In the present specification, for the convenience of description, among various thin film transistors which can be included in the light emitting display apparatus 100, only a driving thin film transistor is illustrated, but a switching thin film transistor can also be included. Further, in the present specification, even though it is described that the thin film transistor 130 has a coplanar structure, a thin film transistor having an inverted staggered structure can also be used.

The semiconductor layer 131 can be configured by an oxide semiconductor or an amorphous semiconductor. The amorphous semiconductor can be configured by amorphous silicon. The semiconductor layer can be configured by polycrystalline silicon, but is not limited thereto. The polycrystalline silicon has a better mobility than that of the amorphous silicon and has low power consumption and excellent reliability so as to be applied to the driving thin film transistor in the pixel.

The first passivation layer 141 is conformally disposed on an upper surface of the thin film transistor 130. For example, the first passivation layer 141 can be formed along a shape of the upper surface of the thin film transistor 130. The first passivation layer 141 is formed to cover the thin film transistor 130, and is also disposed on the entire surface of the lower substrate 110 on which the thin film transistor 130 is disposed. Further, with reference to FIG. 1A, the first passivation layer 141 is formed so as to overlap all the plurality of sub pixels SP.

The first passivation layer 141 can be formed to have a thickness of 10 µm or smaller, for example, can be formed to have a thickness of 0.5 µm, but is not limited thereto.

As described above, the first passivation layer 141 can be disposed so as to cover the thin film transistor 130. The first passivation layer 141 can protect the thin film transistor 130 from oxygen or moisture from the outside of the light emitting display apparatus 100. Various organic layers or inorganic layers can be used for the first passivation layer 141. The first passivation layer 141 can be formed by various structures such as a single deposition structure of an organic layer, a single deposition structure of an inorganic layer, or an alternative deposition structure of organic layer/inorganic layer. For example, the first passivation layer 141 can be formed of silicon nitride $SiN_x$ or silicon oxide $SiO_x$, but is not limited thereto.

The color filter CF can be disposed on the first passivation layer 141 so as to overlap the emission area of the sub pixel SP. Since the color filter CF is disposed in the emission area of the sub pixel SP, the color filter CF is disposed on the upper layer of the thin film transistor 130, but disposed not to overlap the thin film transistor 130.

Each color filter CF can include a red color filter CF including a red pigment, a green color filter CF including a green pigment, and a blue color filter including a blue pigment so as to implement colors of the sub pixels SP.

In order to form a color filter CF, the red color filter CF, the green color filter CF, and the blue color filter CF need to be subjected to a coating process, an exposure process, a development process, and a post-bake process.

Among these processes, during the post-back process, a pigment layer for forming the color filter CF is heated so that gases including hydrogen included in the pigment layer are discharged.

In spite of the post-bake process, hydrogen can remain in the color filter CF. Therefore, the residual hydrogen included in the color filter CF can move in the light emitting display apparatus 100 and is diffused to the semiconductor layer 131 of the thin film transistor 130 so that the characteristic of the thin film transistor 130 can be changed. For example, the semiconductor layer 131 can absorb hydrogen. When the semiconductor layer 131 absorbs hydrogen, a threshold voltage $V_{th}$ of the thin film transistor 130 is shifted so that the mobility of the thin film transistor 130 can be increased. Therefore, the characteristic of the thin film transistor 130 is changed so that the performance is degraded, spots or bright spots are generated, and the luminance irregularity is caused. Therefore, the hydrogen generated during the process of forming the color filter CF can degrade not only the performance of the thin film transistor 130, but also the performance of the light emitting display apparatus 100 so that it is necessary to remove the residual hydrogen in the color filter CF.

The over coating layer 160 is disposed on the gate insulating layer 120, the thin film transistor 130, the first passivation layer 141, and the color filter CF. The over coating layer 160 is formed to cover the thin film transistor 130 and the first passivation layer 141 and planarizes the upper portion of the thin film transistor 130 and the first passivation layer 141. The over coating layer 160 can be formed of an insulating material.

A light emitting diode 150 including an anode 151, a light emitting layer 152, and a cathode 153 and a bank 170 are formed on the over coating layer 160. For example, the anode 151 which supplies holes to the light emitting layer 152 is formed on an upper surface of the over coating layer 160, the light emitting layer 152 is formed on the anode 151, and the cathode 153 which supplies electrons to the light emitting layer 152 is formed on the light emitting layer 152.

When the light emitting display apparatus 100 is a bottom emission type, for example, the anode 151 can include a transparent conductive layer formed of a transparent conductive oxide (hereinafter, abbreviated as TCO) such as indium tin oxide (ITO) or indium zinc oxide (IZO), or ZnO. Further, the cathode 153 can be formed of a metal material having a low optical transmittance.

When the light emitting display apparatus 100 is a top emission type, the anode 151 can include a reflective layer and a transparent conductive layer which is formed of a transparent conductive oxide on the reflective layer. Further, the cathode 153 can be formed with a thin metal material having a low work function or formed of a transparent conductive oxide. When the cathode 153 is formed of a transparent conductive oxide, a multiple layer can be disposed between the cathode 153 and the light emitting layer 152 so that the electrons move through the cathode 153. For example, a metal-doped layer can be disposed between the light emitting layer 152 and the cathode 153. Further, an organic buffer layer can be additionally disposed between the light emitting layer 152 and the metal-doped layer.

The bank 170 is formed to cover the side of the anode 151 to define an emission area of each sub pixel SP.

For example, as illustrated in FIG. 1B, the bank 170 is in contact with an upper portion of the first passivation layer 141 and is formed so as to enclose the side of the anode 151 and the side of the over coating layer 160. By doing this, the bank 170 can block the entering and diffusion of the moisture and impurities from the side of the over coating layer 160.

The second passivation layer 142 is conformally disposed on an outer surface of the light emitting diode 150. For example, the second passivation layer 142 can be formed along shapes of an upper surface and a side of the cathode 153. For example, the second passivation layer 142 can be formed not only to enclose the side of the cathode 153, but also to be in contact with the first passivation layer 141. Further, with reference to FIG. 1A, the second passivation layer 142 is formed so as to overlap all the plurality of sub pixels SP.

Further, the second passivation layer 142 can also be formed to have a thickness of 10 μm or smaller, for example, can be formed to have a thickness of 0.5 μm, but is not limited thereto.

As described above, the second passivation layer 142 can be disposed so as to cover the light emitting diode 150. The second passivation layer 142 can protect the light emitting diode 150 from oxygen or moisture from the outside of the light emitting display apparatus 100. Various organic layers or inorganic layers can be used for the second passivation layer 142. The second passivation layer 142 can be formed by various structures such as a single deposition structure of an organic layer, a single deposition structure an inorganic layer, or an alternative deposition structure of an organic layer/an inorganic layer. For example, the second passivation layer 142 can be formed of silicon nitride $SiN_x$ or silicon oxide $SiO_x$, but is not limited thereto.

The passivation layer 140 including the first passivation layer 141 and the second passivation layer 142 is formed by a chemical vapor deposition (CVD) method using gas containing hydrogen (for example, silane ($SiH_4$) and ammonia ($NH_3$)). Therefore, during the process of forming the passivation layer 140, hydrogen can be generated, and the generated hydrogen is diffused to the passivation layer 140 to be included in the passivation layer 140. Here, hydrogen may refer to the element of hydrogen, and can include hydrogen atom (H) and hydrogen molecule ($H_2$). For example, the hydrogen remaining in the passivation layer 140 can be diffused in all directions. The diffusion can proceed according to a concentration gradient, for example, a chemical potential. Therefore, the residual hydrogen included in the passivation layer 140 can move in the light emitting display apparatus 100 and is diffused to the semiconductor layer 131 of the thin film transistor 130 so that the characteristic of the thin film transistor 130 can be changed. For example, the semiconductor layer 131 can absorb hydrogen. When the semiconductor layer 131 absorbs hydrogen, a threshold voltage $V_{th}$ of the thin film transistor 130 is shifted so that the mobility of the thin film transistor 130 can be increased. Therefore, the characteristic of the thin film transistor 130 is changed so that the performance is degraded, spots or bright spots are generated, and the luminance irregularity is caused. Therefore, the hydrogen generated during the process of forming the passivation layer 140 can degrade not only the performance of the thin film transistor 130, but also the performance of the light emitting display apparatus 100 so that it is necessary to remove the residual hydrogen in the passivation layer 140. Further, the characteristic of the thin film transistor 130 is changed due to the residual hydrogen in the passivation layer 140 depending on the material of the upper substrate 119 so that bright spots can be generated.

Therefore, in order to remove the hydrogen remaining in the color filter CF and the passivation layer 140, a hydrogen absorbing layer 180 can be disposed to cover the upper surface and the side of the second passivation layer 142. For example, the hydrogen absorbing layer 180 can be in contact not only with the upper surface of the second passivation layer 142, but also with the side of the second passivation layer 142 to cover an outer surface of the second passivation layer 142 to be planarized. Further, one side of (or one portion of) a lower surface of the hydrogen absorbing layer 180 can be in contact with the first passivation layer 141.

As described above, since the hydrogen absorbing layer 180 is formed to be in contact with the first passivation layer 141 and the second passivation layer 142, a contact area of the hydrogen absorbing layer 80 and the first passivation layer 141 and the second passivation layer 142 can be increased. Therefore, the hydrogen absorbing layer 180 can effectively absorb the hydrogen included in the first passivation layer 141 and the second passivation layer 142.

The hydrogen absorbing layer 180 can be formed to have a thickness of 5000 Å or smaller, for example, can be formed to have a thickness of 50 μm at maximum, but is not limited thereto. The hydrogen absorbing layer 180 can be a seal and is not limited to the term. The seal can be disposed on the entire light emitting diode.

The seal can be formed based on a curable resin or a photo curable resin. For example, the curable resin can be epoxy resin, but is not limited thereto. For example, the photo curable resin can be polyolefin resin, but is not limited thereto.

Further, one side of the hydrogen absorbing layer 180 and one side of the upper substrate 119 can further include a side seal member 190 which edges the side of the light emitting display apparatus 100. For example, the side seal member 190 can be in contact with one side of the upper surface of the first passivation layer 141, one side of the hydrogen absorbing layer 180, and one side of the upper substrate 119. Further, the side seal member 190 can minimize the moisture permeation at the side. To this end, the side seal member 190 can be formed of, for example, an acryl, urethane, and silicon based curable material, but is not limited thereto.

The above-described hydrogen absorbing layer 180 can include an inorganic material FT which absorbs or adsorbs hydrogen (for example, hydrogen atom (H) and hydrogen molecule ($H_2$)) or moisture to serve as a filter to absorb the residual hydrogen in the color filter CF and the passivation layer 140. The inorganic material FT can be a hydrogen absorbing filler and absorb or adsorb hydrogen or moisture. The filler can be powder or particle, and is not limited to this terminology or form. For example, the filler can be flakes, nodules or other forms. The inorganic material FT of the hydrogen absorbing layer 180 can include at least one of a metal, a mixture including a metal, and a compound including a metal. For example, the hydrogen absorbing layer 180 can be configured to include a metal, a mixture of metal, a compound of metal, a combination of a metal and a mixture of metal, a combination of a metal and a compound of metal, a combination of a mixture of metal and a compound of metal, or a combination of a metal, a mixture of metal, and a compound of metal. Here, the metal can include one or more of an alkali metal, an alkaline earth metal, a rare earth metal, a titanium (Ti) Ground metal, a transition metal, and a post transition metal. However, embodiments are not limited thereto. For, example, "post transition metals" may refer to the metal elements of in the 13th group to 15th group of the element periodic table. Further, the metal can be a particle having a diameter of several to several tens nanometer (nm). For example, the metal can be a particle having a diameter of 100 nm or smaller, but is not limited thereto.

The inorganic material FT of the hydrogen absorbing layer 180 can absorb hydrogen in various manners. For example, the inorganic material FT of the hydrogen absorbing layer 180 can absorb hydrogen through a chemical reaction or absorb the hydrogen by trapping the hydrogen in a gap between the inorganic materials FT.

The inorganic material FT of the hydrogen absorbing layer 180 reacts with the remaining hydrogen in the color filter CF and the passivation layer 140 to generate a hydrogen compound. Therefore, the hydrogen compound obtained by the reaction of the inorganic material FT of the hydrogen absorbing layer 180 with the remaining hydrogen in the color filter CF and the passivation layer 140 can be included in the hydrogen absorbing layer 180. For example, the hydrogen absorbing layer 180 can include not only the inorganic material FT, but also the hydrogen compound. The hydrogen compound generated in the hydrogen absorbing layer 180 can be formed by a reaction represented by the following Chemical Formula 1.

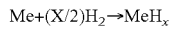  [Chemical Formula 1]

$Me + (X/2)H_2 \rightarrow MeH_x$

[Chemical Formula 1] is a chemical formula which explains a process in which the inorganic material FT of the hydrogen absorbing layer 180 reacts with the remaining hydrogen to generate a hydrogen compound $MeH_x$. Here, Me refers to a metal. However, not only the metal, but also a metal compound or a metal mixture can react with hydrogen as represented in Chemical Formula 1 to form a hydrogen compound. In embodiments, the hydrogen compound can be one or more metal halides or halides.

Therefore, when the inorganic material FT of the hydrogen absorbing layer 180 reacts with the residual hydrogen in the color filter CT and the passivation layer 140 to generate a hydrogen compound, an energy is generated or absorbed. Such an energy is referred to as a hydrogen adsorption energy.

In this regard, in Table 1, when a temperature is 298 K, a hydrogen adsorption energy in accordance with a type of metal is represented. In this regard, when the hydrogen adsorption energy is positive, it means that when metal and hydrogen which are inorganic materials FT are adsorbed, metal and hydrogen generate heat and spontaneously react. When the hydrogen adsorption energy is negative, it means that when metal and hydrogen which are inorganic materials FT are adsorbed, metal and hydrogen absorb heat and involuntarily react with each other.

TABLE 1

| Type of metal | Hydrogen adsorption energy [eV] |
| --- | --- |
| Vanadium (V) | −0.08 |
| Nickel (Ni) | 0.02 |
| Palladium (Pd) | 0.05 |
| Copper (Cu) | −0.05 |
| Iron (Fe) | −0.01 |

For example, it means that the hydrogen adsorption reaction is more spontaneously generated as the hydrogen adsorption energy is lower so that the adsorption reaction with hydrogen satisfactorily occurs in the order of vanadium (V), copper (Cu), iron (Fe), nickel (Ni), and palladium (Pd).

In Table 1, the hydrogen adsorption energy at a temperature of 298 K is represented. However, a process temperature is generally higher than 300 K, so that the hydrogen adsorption energy can be lower than that described in Table 1.

For example, the inorganic material FT included in the hydrogen absorbing layer 180 can include one or more of a metal such as thorium (Th), zirconium (Zr), vanadium (V), palladium (Pd), titanium (Ti), magnesium (Mg), nickel (Ni), tin (Sn), platinum (Pt), chrome (Cr), silver (Ag), aluminum (Al), copper (Cu), gold (Au), cobalt (Co), and iron (Fe), lanthanum-nickel (La—Ni), lanthanum-nickel-aluminum (La—Ni—Al), nickel-magnesium (Ni—Mg), iron-titanium (Fe—Ti), and titanium-manganese (Ti—Mn), but is not limited thereto.

In addition to the inorganic material FT, the material included in the hydrogen absorbing layer 180 can be at least one of carbon nano tube (CNT) and graphene, but is not limited thereto.

The semiconductor layer 131 included in the light emitting display apparatus according to the embodiment of the present disclosure can be formed by an oxide semiconductor. The oxide semiconductor has excellent mobility and uniformity. The semiconductor layer can be configured by the oxide semiconductor such as an indium tin gallium zinc oxide (InSnGaZnO) based material which is a quaternary metal oxide, an indium gallium zinc oxide (InGaZnO) based material, an indium tin zinc oxide (InSnZnO) based material, an indium aluminum zinc oxide (InAlZnO) based material, a tin gallium zinc oxide (SnGaZnO) based material, an aluminum gallium zinc oxide (AlGaZnO) based material, a tin aluminum zinc oxide (SnAlZnO) based material which are ternary metal oxides, an indium zinc oxide (InZnO) based material, a tin zinc oxide (SnZnO) based material, an aluminum zinc oxide (AlZnO) based material, a zinc magnesium oxide (ZnMgO) based material, a tin magnesium oxide (SnMgO) based material, an indium magnesium oxide (InMgO) based material, an indium gallium oxide (InGaO) based material which are bimetallic oxides, an indium oxide (InO) based material, a tin oxide (SnO) based material, and a zinc oxide (ZnO) based material, but a composition ratio of individual elements is not limited.

As described above, when the semiconductor layer 131 is an oxide semiconductor, the residual hydrogen included in the color filter CF and the passivation layer 140 is diffused to the semiconductor layer 131 configured by the oxide semiconductor. Therefore, the semiconductor layer 131 configured by the oxide semiconductor is reduced so that the concentration of electrons is increased. Therefore, in the semiconductor layer 131 configured by the oxide semiconductor, a channel through which unintended leakage current can flow can be formed due to the high electron concentration to cause bright spots. Therefore, the light emitting display apparatus according to the embodiment of the present disclosure removes the residual hydrogen included in the color filter CF and the passivation layer 140 so that the problem caused when the semiconductor layer 131 is configured by the oxide semiconductor can be solved. For example, even though the hydrogen is diffused from the color filter CF and the passivation layer 140, the diffused hydrogen is absorbed by the inorganic material FT of the hydrogen absorbing layer 180 so that the hydrogen need not affect the semiconductor layer 131 configured by the oxide semiconductor.

Further, a seal including the hydrogen absorbing layer 180 or a hydrogen absorbing filler is configured so that the problem in that the bright spot is generated depending on the material of the upper substrate can be solved.

The upper substrate 119 can be a metal, a plastic film, and glass, but is not limited thereto. For example, the metal can be iron-nickel (Fe—Ni), but is not limited thereto. Therefore, even though the material of the upper substrate 119 is changed, the defect such as the bright spot by the residual hydrogen is reduced, so that the degree of freedom for a material of the upper substrate 119 can be improved.

Figure 2:
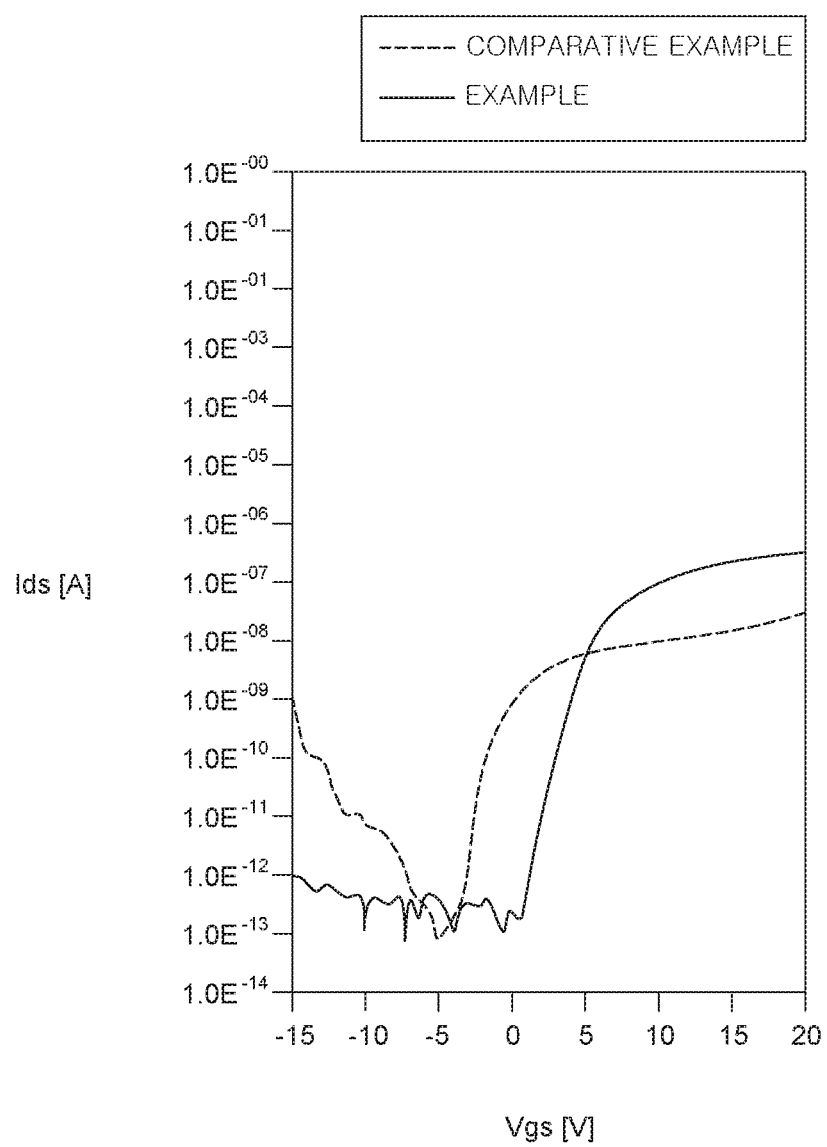
FIG. 2 is a graph for explaining a change in a threshold voltage of a thin film transistor of a light emitting display apparatus according to an embodiment of the present disclosure.

FIG. 2 is a graph for explaining a change in a threshold voltage of a thin film transistor of a light emitting display apparatus according to an embodiment of the present disclosure. The inorganic material FT which absorbs hydrogen can be included with a mass percentage of 0.08% to 50% with respect to a total mass of the hydrogen absorbing layer 180 including an adhesive layer. For example, the inorganic material FT can include a mass percentage of 0.08% to 50% with respect to a total mass of the adhesive layer and the hydrogen absorbing layer of FIG. 3.

For example, a mass percentage of the inorganic material FT which absorbs hydrogen included in the hydrogen absorbing layer 180 can be 0.08% to 50%.

In this regard, when the mass percentage of the inorganic material FT which absorbs hydrogen is lower than 0.08%, the threshold voltage $V_{th}$ of the thin film transistor 130 has a negative change amount with respect to a normal range of 1 V to −1 V, so that the thin film transistor 130 is not controlled, but is always turned on to cause the bright spots in the display apparatus 100. In contrast, when the mass percentage of the inorganic material FT which absorbs hydrogen is 0.08% or higher, the threshold voltage $V_{th}$ of the thin film transistor 130 is 1 V to −1 V which is a normal range, so that the thin film transistor 130 is normally controlled and no bright spot is generated in the display apparatus 100.

With reference to FIG. 2, for example, as described in a comparative example, when the mass percentage of the inorganic material FT which absorbs hydrogen is lower than 0.08%, the threshold voltage $V_{th}$ of the thin film transistor 130 is −5.14 V which is out of a normal range of 1 V to −1V, so that the thin film transistor 130 is not controlled, but is always turned on to cause the bright spots in the display apparatus 100. In contrast, according to an example, when the mass percentage of the inorganic material FT which absorbs hydrogen is 0.08%, the threshold voltage $V_{th}$ of the thin film transistor 130 is 1 V which is within a normal range, so that the thin film transistor 130 is normally controlled and no bright spot is generated in the display apparatus.

When a mass percentage of the inorganic material FT which absorbs hydrogen is 50% or higher, adhesiveness of the hydrogen absorbing layer 180 including an adhesive layer is reduced so that the lower substrate 110 and the upper substrate 119 which is opposite to the lower substrate 110 are not stably bonded. Therefore, mechanical reliability can be degraded. Therefore, the inorganic material FT which absorbs hydrogen can be included with a mass percentage of 0.08% to 50% with respect to a total mass of the hydrogen absorbing layer 180 including the adhesive layer.

The inorganic material FT in the hydrogen absorbing layer 180 can transmit light which is incident onto the hydrogen absorbing layer 180. For example, a transmittance of the hydrogen absorbing layer 180 with respect to light incident onto the hydrogen absorbing layer 180 can be 50% or higher. For example, a transmittance of the hydrogen absorbing layer 180 with respect to light incident onto the hydrogen absorbing layer 180 can be 70% or higher. The light transmitting characteristic of the hydrogen absorbing layer 180 can be advantageous to ensure the transmittance in the top emission type light emitting display apparatus and improve a luminous efficiency.

Further, the hydrogen absorbing layer 180 can further include the adhesive layer to bond the lower substrate 110 and the upper substrate 119 which is opposite to the lower substrate 110. The hydrogen absorbing layer and the adhesive layer can be a seal, but is not limited to this terminology or form.

The hydrogen which is generated during the process of forming the color filter CF and the passivation layer 140 to remain in the color filter CF and the passivation layer 140 can move in the light emitting display apparatus 100. The semiconductor layer 131 absorbs the residual hydrogen to degrade the performance of the thin film transistor 130. Therefore, in the light emitting display apparatus 100 according to the embodiment of the present disclosure, the hydrogen absorbing layer 180 which includes an inorganic material which absorbs hydrogen is disposed to be in contact with an upper surface of the cathode 153 of the light emitting diode 150. Therefore, the hydrogen absorbing layer 180 reacts with the residual hydrogen in the color filter CF and the passivation layer 140 to form a hydrogen compound. Therefore, the hydrogen absorbing layer 180 absorbs or adsorbs the residual hydrogen which moves from the passivation layer 140 to the thin film transistor 130. Therefore, the light emitting display apparatus 100 can suppress the performance degradation of the thin film transistor 130 due to the residual hydrogen which moves through the hydrogen absorbing layer 180, reduce spots or bright spots, and reduce the luminance irregularity.

In some embodiments, the hydrogen absorbing layer 180 can further include a getter in addition to the inorganic material which absorbs hydrogen. The getter can be particles which absorb moisture and gas.

Further, in some embodiments, the inorganic material which absorbs hydrogen can also be included in the over coating layer 160 disposed on the thin film transistor 130 and the bank 170 disposed on the over coating layer 160.

The inorganic material which absorbs hydrogen is also included in the over coating layer 160 and the bank 170 so that the inorganic material included in the over coating layer 160 and the bank 170 absorbs hydrogen through chemical reaction or absorbs the hydrogen by trapping the hydrogen in a gap between inorganic materials.

Therefore, the residual hydrogen which moves from the passivation layer 140 to the thin film transistor 130 can be more efficiently absorbed so that the performance degradation of the thin film transistor 130 due to the moving residual hydrogen can be effectively suppressed.

Figure 3:
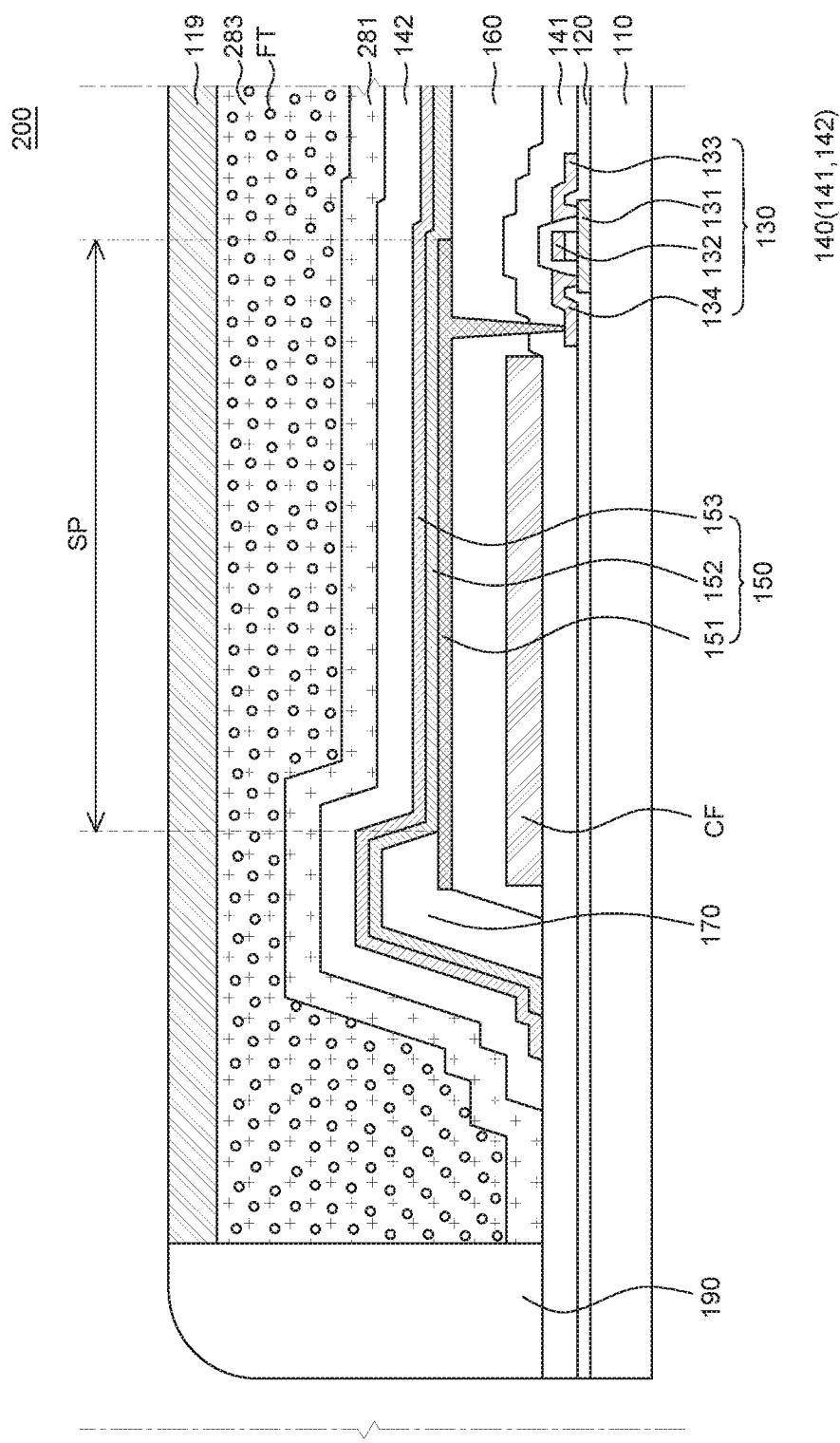
FIG. 3 is a schematic cross-sectional view of one sub pixel of a light emitting display apparatus according to another embodiment of the present disclosure.

FIG. 3 is a schematic cross-sectional view of one sub pixel of a light emitting display apparatus according to another embodiment of the present disclosure. A hydrogen absorbing layer 283 and an adhesive layer 281 of a light emitting display apparatus 200 of FIG. 3 are different from those of the light emitting display apparatus 100 of FIG. 1B, but other components are substantially the same so that a redundant description will be omitted.

With reference to FIG. 3, the adhesive layer 281 is conformally disposed on an outer surface of the second passivation layer 142. For example, the adhesive layer 281 can be formed along shapes of an upper surface and a side of the second passivation layer 142. The adhesive layer 281 can be formed not only to cover the second passivation layer 142, but also to cover one side of the first passivation layer 141.

Here, the adhesive layer 281 bonds the lower substrate 110 and the upper substrate 119 which is opposite to the lower substrate 110. Therefore, the adhesive layer 281 can include an adhesive material. For example, the adhesive layer 281 can be formed of a liquid type or a film type adhesive material. For example, the adhesive layer 281 can be formed of resin, epoxy, or acrylic material, but is not limited thereto.

The hydrogen absorbing layer 283 covers an outer surface of the adhesive layer 281 and an upper surface of the hydrogen absorbing layer 283 can be formed to be flat while being in contact with the upper substrate 119.

Therefore, the hydrogen absorbing layer 283 is formed to be separated and independent from the adhesive layer 281 so that the contact characteristic with the cathode 153 of the light emitting diode 150 which is in contact with the adhesive layer 281 can be improved. Therefore, the light emitting diode 150 and the adhesive layer 281 can be more durably bonded to each other so that the inorganic material included in the hydrogen absorbing layer 283 can absorb hydrogen through a chemical reaction or absorb the hydrogen by trapping the hydrogen in a gap between the inorganic materials.

Accordingly, the residual hydrogen which moves from the color filter CF and the passivation layer 140 to the thin film transistor 130 can be more efficiently absorbed so that the performance degradation of the thin film transistor 130 due to the moving residual hydrogen can be effectively suppressed.

Figure 4:
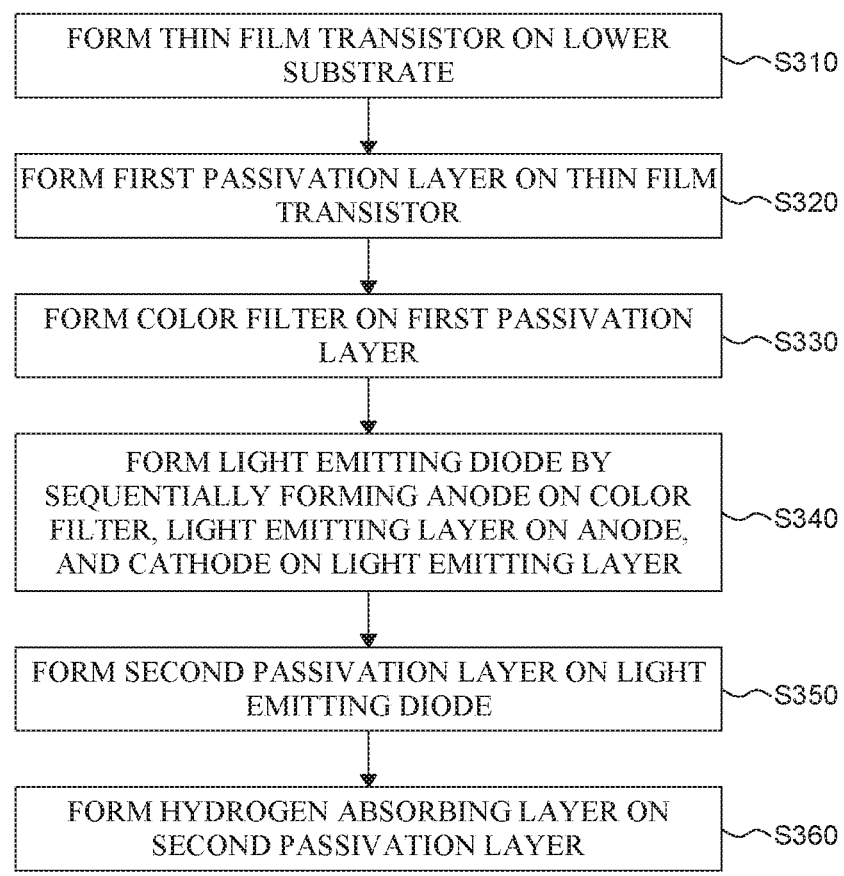
FIG. 4 is a flowchart for explaining a method of manufacturing a light emitting display apparatus according to an embodiment of the present disclosure.

FIG. 4 is a flowchart for explaining a method of manufacturing a light emitting display apparatus according to an embodiment of the present disclosure. Hereinafter, a process order of forming a first passivation layer 141, a color filter CF, a second passivation layer 142, and a hydrogen absorbing layer 180 will be mainly described with reference to FIGS. 1A and 1B.

First, the thin film transistor 130 is formed on the lower substrate 110 in step S310.

With reference to FIG. 1B, the semiconductor layer 131 is formed on the lower substrate 110, the gate insulating layer 120 is formed on the semiconductor layer 131 and the lower substrate 110, the gate electrode 132 is formed on the gate insulating layer 120, and the source electrode 133 and the drain electrode 134 are formed on the semiconductor layer 131 and the gate insulating layer 120 to form the thin film transistor 130.

Next, the first passivation layer 141 is formed on the thin film transistor 130 in step S320.

The first passivation layer 141 is formed by a chemical vapor deposition (CVD) method using silane and ammonia. Therefore, hydrogen can be generated from silane and ammonia used during the process of forming the first passivation layer 141 by the chemical vapor deposition method. The generated hydrogen can be diffused to be included in the first passivation layer 141.

Next, the color filter CF is formed on the first passivation layer 141 in step S330.

In order to form the color filter CF, the red color filter CF, the green color filter CF, and the blue color filter CF are subjected to a coating process, an exposure process, a development process, and a post-bake process. Among these processes, during the post-bake process, a pigment layer for forming the color filter CF is heated so that gases including hydrogen included in the pigment layer are discharged. In spite of the post-bake process, hydrogen can remain in the color filter CF.

Next, the anode 151 is formed on the color filter CF, the light emitting layer 152 is formed on the anode 151, and the cathode 153 is formed on the light emitting layer 152, sequentially, to form the light emitting diode 150 in step S340.

With reference to FIG. 1B, the anode 151 is electrically connected to the drain electrode 134 through a contact hole in the over coating layer 160, the bank 170 is formed so as to cover a part of both ends of the anode 151, and the light emitting layer 152 and the cathode 153 are disposed on the anode 151 and the bank 170 to form the light emitting diode 150.

Next, the second passivation layer 142 is formed on the light emitting diode 150 in step S350.

The second passivation layer 142 is also formed by a chemical vapor deposition (CVD) method using silane and ammonia. Therefore, hydrogen can be generated from silane and ammonia used during the process of forming the second passivation layer 142 by the chemical vapor deposition method. The generated hydrogen can be diffused to be included in the second passivation layer 142. The second passivation layer 142 can be omitted.

Next, the hydrogen absorbing layer 180 is formed on the second passivation layer 142 in step S360.

With reference to FIG. 1B, the hydrogen absorbing layer 180 is formed so as to cover the upper surface and the side of the second passivation layer 142. Here, the hydrogen absorbing layer 180 includes an inorganic material which absorbs hydrogen. When the second passivation layer 142 is not configured, the hydrogen absorbing layer 180 can be disposed along the upper surface and the side of the light emitting diode 150. For example, the hydrogen absorbing layer 180 can be disposed so as to be in contact with the upper surface of the cathode 153 of the light emitting diode 150. For example, the hydrogen absorbing layer 180 can be disposed so as to be in contact with the upper surface and the side of the cathode 153 of the light emitting diode 150.

The hydrogen absorbing layer 180 can be formed by performing a chemical vapor deposition method, a sputtering method, or a thermal evaporation method on the inorganic material. Specifically, as illustrated in FIG. 1B, when the hydrogen absorbing layer 180 is formed so as to be in contact with the upper surface of the second passivation layer 142, the hydrogen absorbing layer 180 can be formed by performing a chemical vapor deposition method, a sputtering method, or a thermal evaporation method on the inorganic material on the upper surface of the second passivation layer 142.

In some embodiments, the hydrogen absorbing layer 180 can also be formed by dispersing or doping the inorganic material into the organic material. For example, the organic material is disposed on the second passivation layer 142 and the inorganic material which absorbs hydrogen is dispersed or doped into the organic material to form the hydrogen absorbing layer 180. Here, the organic material can be the same material as the material used for the light emitting layer 152. The hydrogen absorbing layer 180 can be formed to have a thickness of 5000 Å or smaller, for example, can be formed to have a thickness of 50 μm, but is not limited thereto.

In the method of manufacturing a light emitting display apparatus according to the embodiment of the present disclosure, the residual hydrogen can be efficiently removed through the hydrogen absorbing layer 180 without using additional equipment or cost so that the residual hydrogen in the color filter CF and the passivation layer 140 does not affect the mobility of the thin film transistor 130. For example, the hydrogen absorbing layer 180 is formed using a chemical vapor deposition method, a sputtering method, or a thermal evaporation method, so that the light emitting display apparatus 100 can include a configuration which can absorb the residual hydrogen in the color filter CF and the passivation layer 140 without excessive additional cost.

An embodiment of the present disclosure can also be described as follows:

According to an aspect of the present disclosure, a light emitting display apparatus includes a passivation layer on a thin film transistor and includes hydrogen, a light emitting diode on the passivation layer, the light emitting diode having an anode, a light emitting layer on the anode, and a cathode on the light emitting layer, and a hydrogen absorbing layer on the light emitting diode, the hydrogen absorbing layer including an inorganic material having a mass percentage of 0.08% to 50%.

The inorganic material can include at least one of a metal, a mixture including the metal, and a compound including the metal.

The metal can include one or more of: an alkali metal, an alkaline earth metal, a rare earth metal, a titanium (Ti) Group metal, a transition metal, and a post transition metal.

The metal includes one or more of: thorium (Th), zirconium (Zr), vanadium (V), palladium (Pd), titanium (Ti), magnesium (Mg), nickel (Ni), tin (Sn), platinum (Pt), chrome (Cr), silver (Ag), aluminum (Al), copper (Cu), gold (Au), cobalt (Co), and iron (Fe).

The mixture can include one or more of: lanthanum-nickel (La—Ni), lanthanum-nickel-aluminum (La—Ni—Al), nickel-magnesium (Ni—Mg), iron-titanium (Fe—Ti), and titanium-manganese (Ti—Mn).

The metal can be a particle having a diameter smaller than 100 nm.

The inorganic material can be dispersed in the hydrogen absorbing layer.

The hydrogen absorbing layer can be in contact with the cathode and further includes an adhesive material.

The light emitting display apparatus can further comprise an upper substrate opposite to the lower substrate, and the upper substrate and the lower substrate are attached using the hydrogen absorbing layer.

The hydrogen absorbing layer can further include at least one of a getter and a hydrogen compound.

The light emitting display apparatus can further comprise an upper substrate opposite to the lower substrate; and an adhesive layer being configured to attach the upper substrate and the lower substrate.

The light emitting display apparatus can further comprise an over coating layer on the thin film transistor; and a bank on the over coating layer, wherein the inorganic material is in the over coating layer and the bank.

The bank can be in contact with an upper portion of the first passivation layer and is formed so as to enclose a side surface of the anode and a side surface of the over coating layer.

The thin film transistor can include a semiconductor layer and the semiconductor layer is formed of an oxide semiconductor or an amorphous semiconductor.

The anode can include a transparent conductive layer or includes a reflective layer and a transparent conductive layer on the reflective layer.

The light emitting display apparatus can further comprise a second passivation layer between the light emitting diode and the hydrogen absorbing layer, the second passivation layer includes hydrogen.

The hydrogen absorbing layer can be in contact with an upper surface and a side surface of the second passivation layer.

A portion of a lower surface of the hydrogen absorbing layer can be in contact with the first passivation layer.

The light emitting display apparatus can further comprise a color filter overlapping the light emitting diode, and the color filter includes hydrogen.

The first passivation layer can be disposed to cover an upper surface and side surface of the thin film transistor to protect the thin film transistor from oxygen or moisture from an outside of the light emitting display apparatus.

The light emitting diode can be disposed between the hydrogen absorbing layer and the first passivation layer.

According to another aspect of the present disclosure, a light emitting display apparatus can include a lower substrate, a thin film transistor on the lower substrate, the thin film transistor including an oxide semiconductor layer, a passivation layer on the thin film transistor, a light emitting diode on the thin film transistor and the passivation layer, the light emitting diode including an anode, a light emitting layer on the anode, and a cathode on the light emitting layer, and a seal on the light emitting diode, the seal including a hydrogen absorbing filler.

The hydrogen absorbing filler can be dispersed in the seal.

The hydrogen absorbing filler can include one or more of: thorium (Th), zirconium (Zr), vanadium (V), palladium (Pd), titanium (Ti), magnesium (Mg), nickel (Ni), tin (Sn), platinum (Pt), chrome (Cr), silver (Ag), aluminum (Al), copper (Cu), gold (Au), cobalt (Co), and iron (Fe).

The hydrogen absorbing filler can include one or more of: lanthanum-nickel (La—Ni), lanthanum-nickel-aluminum (La—Ni—Al), nickel-magnesium (Ni—Mg), iron-titanium (Fe—Ti), and titanium-manganese (Ti—Mn).

The seal covers a side surface of the light emitting diode.

The light emitting display apparatus can further include a color filter on the passivation layer in an emission area of the light emitting diode.

The light emitting display apparatus can further comprise an over coating layer on the thin film transistor and the passivation layer, the seal and the passivation layer can surround the light emitting diode and the over coating layer.

The light emitting display apparatus can further comprise an over coating layer on the thin film transistor and the passivation layer, the seal is in contact with the passivation layer at outer portions of the light emitting diode and the over coating layer.

According to another aspect of the present disclosure, a light emitting display apparatus can include a lower substrate which includes a thin film transistor and a light emitting diode, an upper substrate on the lower substrate, an adhesive layer between the lower substrate and the upper substrate, and the adhesive layer being on the thin film transistor, and a seal between the adhesive layer and the upper substrate, the seal including a hydrogen absorbing filler in contact with the adhesive layer.

The hydrogen absorbing filler can include one or more of: thorium (Th), zirconium (Zr), vanadium (V), palladium (Pd), titanium (Ti), magnesium (Mg), nickel (Ni), tin (Sn), platinum (Pt), chrome (Cr), silver (Ag), aluminum (Al), copper (Cu), gold (Au), cobalt (Co), and iron (Fe).

The hydrogen absorbing filler can include one or more of: lanthanum-nickel (La—Ni), lanthanum-nickel-aluminum (La—Ni—Al), nickel-magnesium (Ni—Mg), iron-titanium (Fe—Ti), and titanium-manganese (Ti—Mn).

According to another aspect of the present disclosure, a method of manufacturing a light emitting display apparatus can include: forming a thin film transistor on a lower substrate, forming a passivation layer on the thin film transistor, forming a light emitting diode including an anode, a light emitting layer, and a cathode on the passivation layer, and forming a hydrogen absorbing layer having an inorganic material on the light emitting diode.

The forming of a hydrogen absorbing layer can include performing a chemical vapor deposition method, a sputtering method, or a thermal evaporation method on the inorganic material.

The forming of a hydrogen absorbing layer can include disposing an organic material on the light emitting diode, and dispersing or doping the inorganic material in the organic material.

After the forming of a first passivation layer, forming a color filter on the first passivation layer.

The method can further include after the forming of a light emitting diode, forming a second passivation layer to cover an outer surface of the light emitting diode.

Although the embodiments of the present disclosure have been described in detail with reference to the accompanying drawings, the present disclosure is not limited thereto and can be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display apparatus, comprising:
   a lower substrate;
   a thin film transistor on the lower substrate;
   a first passivation layer on the thin film transistor, the first passivation layer having hydrogen;
   a light emitting diode on the first passivation layer, the light emitting diode having an anode, a light emitting layer on the anode, and a cathode on the light emitting layer; and
   a hydrogen absorbing layer on the light emitting diode, the hydrogen absorbing layer including an inorganic material having a mass percentage of 0.08% to 50%,
   wherein a portion of a lower surface of the hydrogen absorbing layer is in contact with the first passivation layer at outer portions of a plurality of sub pixels.

2. The light emitting display apparatus of claim 1, wherein the inorganic material is dispersed in the hydrogen absorbing layer.

3. The light emitting display apparatus of claim 1, wherein the hydrogen absorbing layer further includes at least one of a getter and a hydrogen compound.

4. The light emitting display apparatus of claim 1, further comprising:
   an upper substrate opposite to the lower substrate; and
   an adhesive layer configured to attach the upper substrate and the lower substrate.

5. The light emitting display apparatus of claim 1, wherein the thin film transistor includes a semiconductor layer, and
   wherein the semiconductor layer is formed of an oxide semiconductor or an amorphous semiconductor.

6. The light emitting display apparatus of claim 1, wherein the anode includes a transparent conductive layer or includes a reflective layer and a transparent conductive layer on the reflective layer.

7. The light emitting display apparatus of claim 1, further comprising:
   a color filter overlapping the light emitting diode,
   wherein the color filter includes hydrogen.

8. The light emitting display apparatus of claim 1, wherein the first passivation layer is disposed to cover an upper surface and side surface of the thin film transistor to protect the thin film transistor from oxygen or moisture from an outside of the light emitting display apparatus.

9. The light emitting display apparatus of claim 1, wherein the light emitting diode is disposed between the hydrogen absorbing layer and the first passivation layer.

10. The light emitting display apparatus of claim 1, wherein the hydrogen absorbing layer is in contact with the cathode and further includes an adhesive material.

11. The light emitting display apparatus of claim 10, further comprising:
    an upper substrate opposite to the lower substrate,
    wherein the upper substrate and the lower substrate are attached by the hydrogen absorbing layer.

12. The light emitting display apparatus of claim 1, further comprising:
    an over coating layer on the thin film transistor; and
    a bank on the over coating layer,
    wherein the inorganic material is in the over coating layer and the bank.

13. The light emitting display apparatus of claim 12, wherein the bank is in contact with an upper portion of the first passivation layer and is formed so as to enclose a side surface of the anode and a side surface of the over coating layer.

14. The light emitting display apparatus of claim 1, further comprising:
    a second passivation layer between the light emitting diode and the hydrogen absorbing layer,
    wherein the second passivation layer include hydrogen.

15. The light emitting display apparatus of claim 14, wherein the hydrogen absorbing layer is in contact with an upper surface and a side surface of the second passivation layer.

16. The light emitting display apparatus of claim 1, wherein the inorganic material includes at least one of a metal, a mixture including the metal, and a compound including the metal.

17. The light emitting display apparatus of claim 16, wherein the metal includes one or more of an alkali metal, an alkaline earth metal, a rare earth metal, a titanium (Ti) Group metal, a transition metal, and a post transition metal.

18. The light emitting display apparatus of claim 16, wherein the metal includes one or more of thorium (Th), zirconium (Zr), vanadium (V), palladium (Pd), titanium (Ti), magnesium (Mg), nickel (Ni), tin (Sn), platinum (Pt), chrome (Cr), silver (Ag), aluminum (Al), copper (Cu), gold (Au), cobalt (Co), and iron (Fe).

19. The light emitting display apparatus of claim 16, wherein the mixture includes one or more of lanthanum-nickel (La—Ni), lanthanum-nickel-aluminum (La—Ni—Al), nickel-magnesium (Ni—Mg), iron-titanium (Fe—Ti), and titanium-manganese (Ti—Mn).

20. The light emitting display apparatus of claim 16, wherein the metal is a particle having a diameter smaller than 100 nm.

21. A light emitting display apparatus, comprising:
    a lower substrate;
    a thin film transistor on the lower substrate, the thin film transistor including an oxide semiconductor layer;
    a passivation layer on the thin film transistor;
    an over coating layer on the thin film transistor and the passivation layer;
    a light emitting diode on the over coating layer, the light emitting diode including an anode, a light emitting layer on the anode, and a cathode on the light emitting layer; and
    a seal on the light emitting diode, the seal including a hydrogen absorbing filler,
    wherein the seal is in contact with the passivation layer at outer portions of the light emitting diode and the over coating layer.

22. The light emitting display apparatus of claim 21, wherein the hydrogen absorbing filler is dispersed in the seal.

23. The light emitting display apparatus of claim 21, wherein the hydrogen absorbing filler includes one or more of thorium (Th), zirconium (Zr), vanadium (V), palladium (Pd), titanium (Ti), magnesium (Mg), nickel (Ni), tin (Sn), platinum (Pt), chrome (Cr), silver (Ag), aluminum (Al), copper (Cu), gold (Au), cobalt (Co), and iron (Fe).

24. The light emitting display apparatus of claim 21, wherein the hydrogen absorbing filler includes one or more of lanthanum-nickel (La—Ni), lanthanum-nickel-aluminum (La—Ni—Al), nickel-magnesium (Ni—Mg), iron-titanium (Fe—Ti), and titanium-manganese (Ti—Mn).

25. The light emitting display apparatus of claim 21, wherein the seal covers a side surface of the light emitting diode.

26. The light emitting display apparatus of claim 21, further comprising:
    a color filter on the passivation layer in an emission area of the light emitting diode.

27. The light emitting display apparatus of claim 21, further comprising:
    an over coating layer on the thin film transistor and the passivation layer,
    wherein the seal and the passivation layer surrounds the light emitting diode and the over coating layer.

28. A light emitting display apparatus, comprising:
    a lower substrate including a thin film transistor and a light emitting diode;
    an upper substrate on the lower substrate;
    an adhesive layer between the lower substrate and the upper substrate, the adhesive layer being on the thin film transistor; and
    a seal between the adhesive layer and the upper substrate, the seal including a hydrogen absorbing filler in contact with the adhesive layer,
    wherein the adhesive layer is separate from the seal.

29. The light emitting display apparatus of claim 28, wherein the hydrogen absorbing filler includes one or more of thorium (Th), zirconium (Zr), vanadium (V), palladium (Pd), titanium (Ti), magnesium (Mg), nickel (Ni), tin (Sn), platinum (Pt), chrome (Cr), silver (Ag), aluminum (Al), copper (Cu), gold (Au), cobalt (Co), and iron (Fe).

30. The light emitting display apparatus of claim 28, wherein the hydrogen absorbing filler includes one or more of lanthanum-nickel (La—Ni), lanthanum-nickel-aluminum (La—Ni—Al), nickel-magnesium (Ni—Mg), iron-titanium (Fe—Ti), and titanium-manganese (Ti—Mn).

31. A method of manufacturing a light emitting display apparatus, the method comprising:
    forming a thin film transistor on a lower substrate;
    forming a first passivation layer on the thin film transistor, the passivation layer having hydrogen;
    forming a light emitting diode including an anode, a light emitting layer, and a cathode on the first passivation layer; and
    forming a hydrogen absorbing layer having a mass percentage of 0.08% to 50% of an inorganic material on the light emitting diode,
    wherein a portion of a lower surface of the hydrogen absorbing layer is in contact with the first passivation layer at outer portions of a plurality of sub pixels.

32. The method of claim 31, wherein the forming of a hydrogen absorbing layer includes:
    performing a chemical vapor deposition method, a sputtering method, or a thermal evaporation method of the inorganic material.

33. The method of claim 31, wherein the forming of a hydrogen absorbing layer includes:
    disposing an organic material on the light emitting diode; and
    dispersing or doping the inorganic material in the organic material.

34. The method of claim 31, further comprising:
    after the forming of a first passivation layer, forming a color filter on the first passivation layer.

35. The method of claim 31, further comprising:
    after the forming of a light emitting diode, forming a second passivation layer to cover an outer surface of the light emitting diode.

* * * * *